United States Patent
Rochas et al.

(10) Patent No.: US 12,055,638 B2
(45) Date of Patent: Aug. 6, 2024

(54) DEVICE OF ACQUISITION OF A DEPTH IMAGE OF A SCENE

(71) Applicant: Commissariat à l'Énergie Atomique et aux Énergies Alternatives, Paris (FR)

(72) Inventors: Alexis Rochas, Grenoble (FR); François Ayel, Grenoble (FR); Yvon Cazaux, Grenoble (FR); Gaelle Palmigiani, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 497 days.

(21) Appl. No.: 17/495,761

(22) Filed: Oct. 6, 2021

(65) Prior Publication Data
US 2022/0113424 A1 Apr. 14, 2022

(30) Foreign Application Priority Data
Oct. 8, 2020 (FR) ...................................... 2010310

(51) Int. Cl.
*G01S 17/894* (2020.01)
*H04N 23/56* (2023.01)

(52) U.S. Cl.
CPC ........... *G01S 17/894* (2020.01); *H04N 23/56* (2023.01)

(58) Field of Classification Search
None
See application file for complete search history.

(56) References Cited

U.S. PATENT DOCUMENTS

| 2012/0153127 A1* | 6/2012 | Hirigoyen | H01L 27/14609 257/E31.127 |
| 2013/0234029 A1 | 9/2013 | Bikumandla | |
| 2016/0181226 A1 | 6/2016 | Wan | |

(Continued)

FOREIGN PATENT DOCUMENTS

| EP | 3 503 192 A1 | 6/2019 |
| FR | 2010310 | 6/2021 |

OTHER PUBLICATIONS

Preliminary Search Report for French Application No. 2010310, dated Jun. 14, 2021.

(Continued)

*Primary Examiner* — Tony Ko
(74) *Attorney, Agent, or Firm* — Wolf, Greenfield & Sacks, P.C.

(57) ABSTRACT

A device of acquisition of a depth image of a scene by detection of a reflected light signal. The device includes a stack of a first sensor and of a second sensor. The first sensor includes first depth photosites configured to acquire at least one first sample of charges photogenerated during first time periods. The second sensor includes second depth photosites arranged opposite the first photosites, the second photosites being configured to acquire at least one second sample of charges photogenerated during second time periods offset with respect to the first time periods by a first constant phase shift. The first sensor or the second sensor further includes third photosites configured to acquire at least one third sample during third time periods offset with respect to the first time periods by a second constant phase shift.

19 Claims, 7 Drawing Sheets

(56) References Cited

U.S. PATENT DOCUMENTS

| | | |
|---|---|---|
| 2017/0278826 A1 | 9/2017 | Sugizaki et al. |
| 2019/0086519 A1 | 3/2019 | Roy et al. |
| 2019/0191067 A1 | 6/2019 | Vaillant et al. |

OTHER PUBLICATIONS

Lange et al., Solid-state time-of-flight range camera. IEEE Journal of quantum electronics. Mar. 2001;37(3):390-7.

* cited by examiner

DEVICE OF ACQUISITION OF A DEPTH IMAGE OF A SCENE

CROSS-REFERENCE TO RELATED APPLICATION

This application claims priority to French application number FR20/10310, filed Oct. 8, 2021. The contents of which is incorporated herein by reference in its entirety.

TECHNICAL BACKGROUND

The present application concerns the field of devices of acquisition of a depth image of a scene.

PRIOR ART

Image acquisition devices capable of acquiring depth information have been provided. For example, indirect time-of-flight (iToF) detectors act to emit a light signal towards a scene, and then to detect the return light signal reflected by objects of the scene. By the estimation of the phase shift between the emitted light signal and the reflected signal, the distance to the device of acquisition of images of the scene can be estimated.

It is desirable to have a high-resolution image acquisition device, of small dimensions, and having a high image rate.

SUMMARY

An embodiment provides a device of acquisition of a depth image of a scene by detection of a reflected light signal corresponding to the reflection on the scene of a periodically amplitude-modulated incident light signal in near infrared, the device comprising a stack of a first sensor and of a second sensor, the first sensor comprising first depth photosites configured to acquire at least one first sample of charges photogenerated by detection of the light signal reflected during first time periods, the second sensor comprising second depth photosites arranged opposite the first depth photosites, the second depth photosites being configured to acquire at least one second sample of charges photogenerated by detection of the light signal reflected during second time periods offset with respect to the first time periods by a first constant phase shift, the first sensor or the second sensor further comprising third depth photosites configured to acquire at least one third sample by detection of the light signal reflected during third time periods offset with respect to the first time periods by a second constant phase shift different from the first phase shift.

According to an embodiment, the device further comprises means for compensating for the difference in quantities of received photons between the first and second sensors.

According to an embodiment, the first sensor is formed inside and on top of a first semiconductor substrate and the second sensor is formed inside and on top of a second semiconductor substrate.

According to an embodiment, the first and second semiconductor substrates are made of different materials.

According to an embodiment, the thicknesses of the first and second semiconductor substrates are different.

According to an embodiment, the lateral dimensions of the first depth photosites are different from the lateral dimensions of the second depth photosites.

According to an embodiment, the first and third depth photosites are confounded.

According to an embodiment, the first and third depth photosites are distinct.

According to an embodiment, the first sensor or the second sensor comprises fourth depth photosites configured to acquire at least one fourth sample by detection of the light signal reflected during fourth time periods offset with respect to the first time periods by a third constant phase shift different from the first and second phase shifts.

According to an embodiment, the second and fourth depth photosites are confounded.

According to an embodiment, the second and fourth depth photosites are distinct.

According to an embodiment, the second time periods are longer than the first time periods.

According to an embodiment, each first and second depth photosite comprises a photodiode and at least one transistor connected to the photodiode.

According to an embodiment, the first sensor further comprises a plurality of 2D image pixels, the second sensor comprising no 2D image pixels.

An embodiment also provides a system of acquisition of a depth image comprising the acquisition device such as previously defined, a light source configured to emit the periodically amplitude-modulated incident light signal in near infrared, and a processor configured to determine, from the first, second, and third samples, a phase shift between the incident light signal and the reflected light signal.

According to an embodiment, the processor is configured to determine, from the first, second, third, and fourth samples, a phase shift between the incident light signal and the reflected light signal.

According to an embodiment, the system further comprises means for compensating for the difference in quantities of received photons between the first and second sensors.

According to an embodiment, the processor is configured to compensate by digital processing for the difference in quantities of received photons between the first and second sensors.

According to an embodiment, the system comprises first amplifiers of the analog signals delivered by the first depth photosites with a first amplification gain and second amplifiers of the analog signals delivered by the second depth photosites with a second amplification gain different from the first amplification gain.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the forming of the photodiodes of the 2D image pixels and of the depth pixels has not been detailed, the forming of such pixels being within the abilities of those skilled in the art based on the indications of the present description. Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred to the orientation of the drawings or to a depth image acquisition device in a normal position of use. Unless specified otherwise, the expressions "around", "approximately", "substantially" and "in the order of" signify within 10%, and preferably within 5%.

Figure 1:
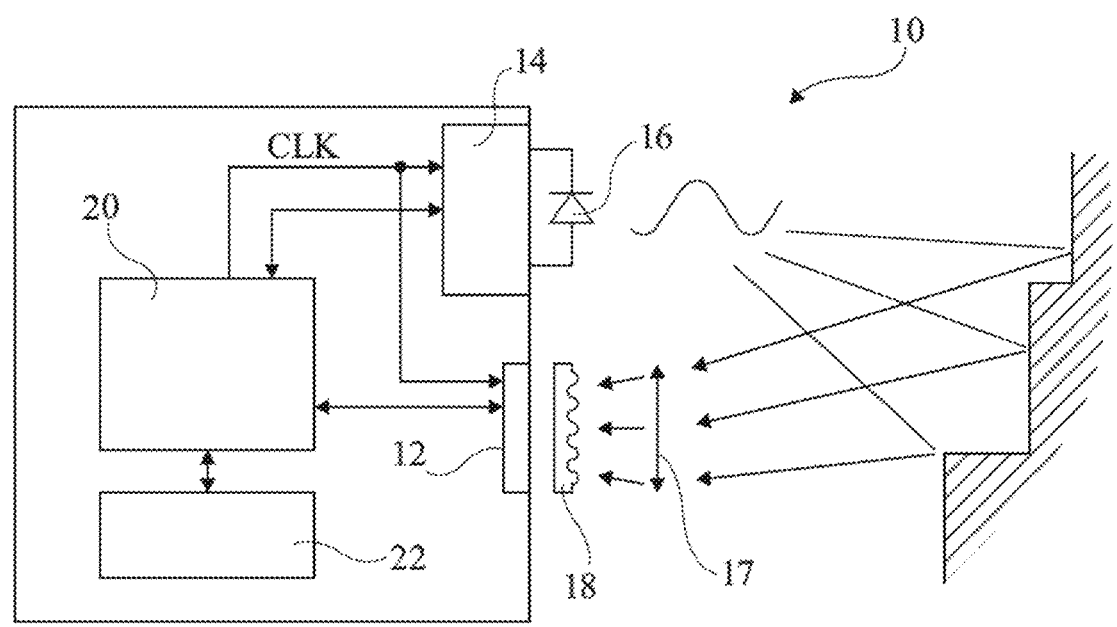
FIG. 1 schematically shows an embodiment of a depth image forming system.

FIG. 1 schematically shows an embodiment of a system 10 for forming a depth image comprising a depth image acquisition device 12. System 10 for example comprises a light signal emission circuit 14 which drives a light source 16, for example, a light-emitting diode (LED). Light-emitting diode 16 for example emits a light signal at a wavelength in the near infrared spectrum, for example, in the range from 700 nm to 1,100 nm. The light signal generated by light-emitting diode 16 is for example emitted towards the image scene via one or a plurality of lenses (not shown in FIG. 1). The light of the light signal reflected from the image scene is captured by image acquisition device 12, for example, via an image-forming lens 17 and an array of microlenses 18, which focuses the light on the individual pixels of image acquisition device 12.

Image acquisition device 12 for example comprises a plurality of pixels capable of receiving the light signal reflected by the image scene and of detecting the phase of the received signal to form a depth image. These pixels are called depth pixels hereafter.

A processor 20 of image forming system 10 is for example coupled to image acquisition device 12 and to light signal emission circuit 14 and determines, based on the signals captured by the depth pixels of image acquisition device 12, the corresponding distances of the objects in the image scene. The depth image generated by processor 20 is for example stored in a memory 22 of image forming system 10.

Figure 2:
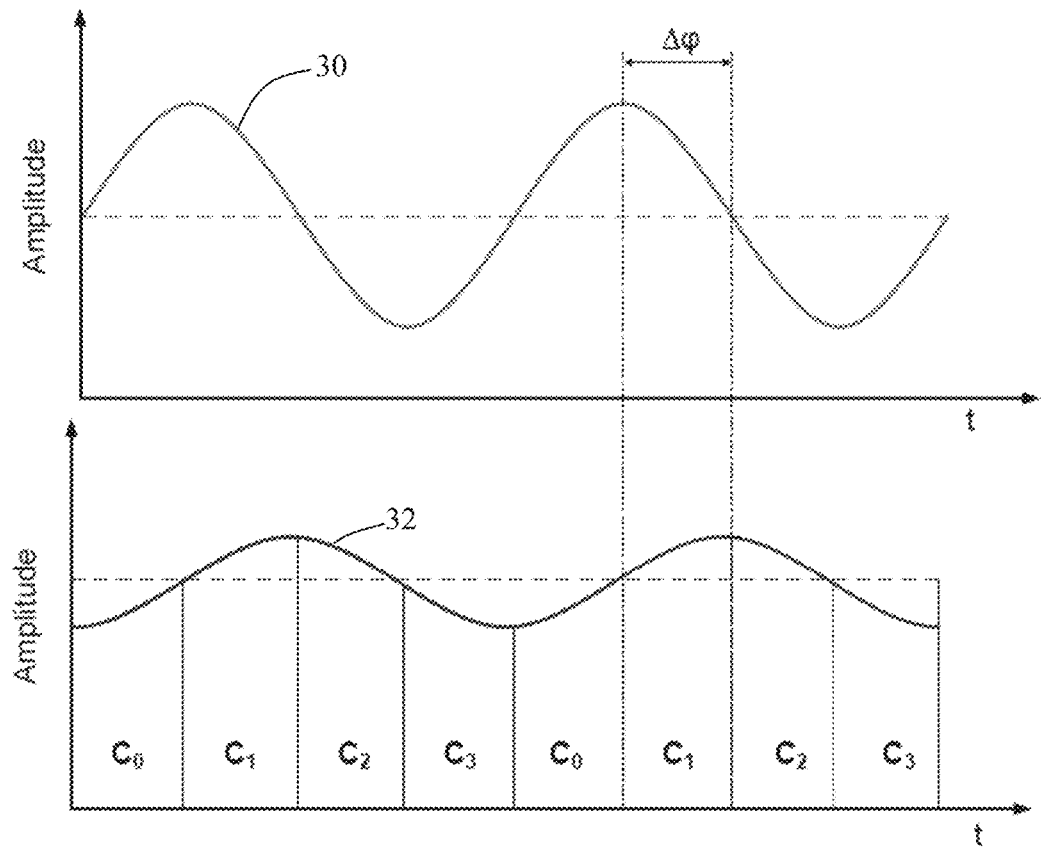
FIG. 2 is a graph illustrating an example of light intensity of a light signal emitted and reflected according to an embodiment.

FIG. 2 is a graph showing, by a curve 30, an example of time variation of the light intensity of the light signal emitted by light-emitting diode 16 towards the image scene, and, by a curve 32, an example of time variation of the light intensity of the light signal received by one of the depth pixels of image acquisition device 12. Although, to simplify the comparison, these signals are shown in FIG. 2 as having the same intensity, in practice the light signal received by each depth pixel is likely to be notably less intense than the emitted signal. In the example of FIG. 2, the light signal has the shape of a sine wave. However, in alternative embodiments, it may have a different periodic shape, for example formed of a sum of sine waves, of triangular shape, or square-shaped.

The depth pixels of the present description are based on photodetectors used to detect the phase of the received light signal. There is a phase shift $\Delta\varphi$ between the emitted light signal and the received light signal, which represents the time of flight (ToF) of the light signal originating from light-emitting diode 16 to image acquisition device 12 via an object of the image scene which reflects the light signal. An estimate of the distance d to the object in the image scene can thus be calculated by using the equation:

$$d = \frac{c}{4\pi f}\Delta\varphi \qquad \text{[Math 1]}$$

where c designates the speed of light, and f the frequency of the light signal.

Phase shift $\Delta\varphi$ is for example estimated based on a sampling of the signal captured by a depth pixel during at least three distinct sampling windows, preferably during four distinct sampling windows, during each period of the light signal. A technique based on the detection of four samples per period is described in further detail in R. Lange and P. Seitz's publication entitled "Solid-state TOF range camera", IEEE J. on Quantum Electronics, vol. 37, No. 3, March 2001, which is incorporated herein by reference as authorized by law. The present embodiment is for example based on the detection of four samples per period.

The samples of each sampling window are for example integrated over a large number of periods for example over 100,000 periods, or more generally between 10,000 and 100 millions of periods. Each sampling window for example has a duration ranging up to one quarter of the period of the light signal. These sampling windows are called $C_0$, $C_1$, $C_2$, and $C_3$ in FIG. 2 and, in the example of FIG. 2, each sampling window is of a same duration and the four sampling windows have a total cycle time equal to the period of the light signal. More generally, there may or not be a time interval separating a sampling window from the next one and, in certain cases, there may be an overlapping between the sampling windows. Each sampling window for example has a duration in the range from 15% to 35% of the period of the light signal in the case of a pixel capturing four samples per period.

The timing of sampling windows $C_0$ to $C_3$ is controlled to be synchronized with the timing of the emitted light signal. For example, light signal emission circuit 14 generates a light signal based on a clock signal CLK (FIG. 1), and image acquisition device 12 receives the same clock signal CLK to control the time of end of each sampling window by for example using delay elements to introduce the appropriate phase shifts.

Based on the integrated samples of the light signal, and for a purely sine light wave, the phase shift $\Delta\varphi$ of the light signal may be determined by using the following equation:

$$\Delta\varphi = \arctan\frac{C_3 - C_1}{C_0 - C_2} \quad [\text{Math 2}]$$

In certain embodiments, the frequency f of the light signal is 25 MHz, or more generally in the range from 20 MHz to 200 MHz.

In the following description call "photosite" a single photodetector and all the components enabling to acquire at least one sample of charges generated by absorption by this photodetector of the light signal reflected by the scene, a depth image of which is desired, and call "pixel" all the components enabling to acquire all the samples necessary to allow the determination of a depth value. In particular, a pixel may comprise a plurality of photosites.

To determine the phase shift $\Delta\varphi$ between the emitted light signal and the light signal received by the depth pixel, the received light signal is sampled by successively transferring, at regular intervals, charges photogenerated in the photosensitive element of a photosite during the first sampling window $C_0$, charges photogenerated in the photosensitive element of the same photosite or of another photosite during the second sampling window $C_1$, charges photogenerated in the photosensitive element of the same photosite or of another photosite during the third sampling window $C_2$, and charges photogenerated in the photosensitive element of the same photosite or of another photosite during the fourth sampling window $C_3$. These four transfers are repeated a large number of times, for example, 100,000 times before the obtained signals are read by the output circuit.

Figure 3:
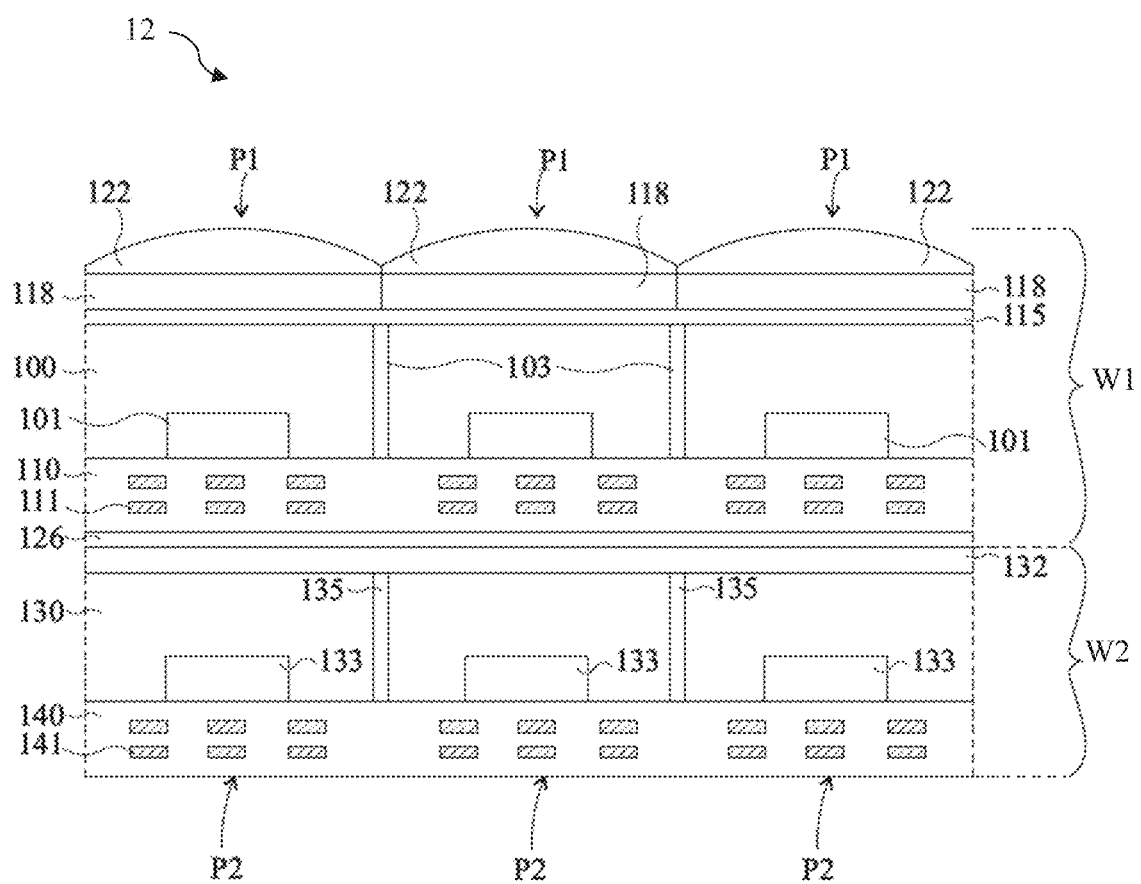
FIG. 3 is a partial simplified cross-section view illustrating an embodiment of a depth image acquisition device.

FIG. 3 is a cross-section view schematically and partially illustrating an embodiment of a device 12 of acquisition of a depth image of a scene.

The device 12 of FIG. 3 comprises:
 a first sensor W1, also called first circuit W1, formed inside and on top of a first semiconductor substrate 100, for example, a single-crystal silicon substrate, sensor W1 comprising a plurality of depth photosites P1, each depth photosite P1 comprising a photodiode; and
 a second sensor W2, also called second circuit W2, formed inside and on top of a second semiconductor substrate 130, for example, a single-crystal silicon substrate, sensor W2 being placed against the back side of sensor W1 and comprising a plurality of depth photosites P2, each depth photosite P2 comprising a photodiode.

It should be noted that in the present description, front side and back side of an element respectively designate the surface of the element intended to face the scene, an image of which is desired to be acquired, and the surface of the element opposite to its front side. In the embodiment of FIG. 3, the front and back sides of acquisition device 12 are respectively its upper surface and its lower surface.

In the shown embodiment, each photosite P1 of sensor W1 comprises a photodiode 101 comprising one or a plurality of local implanted regions formed in semiconductor substrate 100. In this embodiment, the implanted region(s) of photodiode 101 are arranged on the back side of substrate 100. Each pixel P1 may further comprise one or a plurality of additional components (not shown), for example, insulated gate field-effect transistors, also called MOS transistors, formed on the back side of substrate 100, for example, in substrate 100 and on the back side of substrate 100. Sensor W1 further comprises an interconnection stack 110, formed of alternated dielectric and conductive layers coating the back side of substrate 100, where electric connection tracks and/or terminals 111 connecting the photosites P1 of sensor W1 to a peripheral control and power supply circuit, not shown, are formed.

In the shown embodiment, sensor W1 comprises vertical insulating walls 103 crossing substrate 100 across its entire thickness and delimiting substrate portions respectively corresponding to the photosites of sensor W1. Vertical insulating walls 103 particularly have an optical insulation function and may further have an electric insulation function. As an example, vertical insulating walls 103 are made of a dielectric material, for example, silicon oxide. As a variant, insulation walls 103 may not be present.

The thickness of substrate 100 is for example in the range from 2 μm to 10 μm, for example, from 3 μm to 5 μm.

As an example, in top view, the largest dimension of each photosite P1 of sensor W1 is smaller than 10 μm, for example, smaller than 5 μm, for example, smaller than 2 μm, for example, in the order of 1 μm.

In the shown embodiment, the front side of substrate 100 is coated with a passivation layer 115, for example, a silicon oxide layer, a $HfO_2$ layer, a $Al_2O_3$ layer, or a stack of a plurality of layers of different materials capable of having other functions than the passivation function alone (antireflection, filtering, bonding, etc.), extending across substantially the entire surface of sensor W1. As an example, layer 115 is arranged on top of and in contact with the front side of substrate 100.

In the embodiment of FIG. 3, each photosite P1 comprises a filter 118, for example, a black resin layer or an interference filter, arranged on the front side of substrate 100, for example, on top of and in contact with the front side of passivation layer 115, opposite the photodiode 101 of the pixel. Each filter 118 is adapted to transmitting light in the emission wavelength range of light source 16. Preferably, filter 118 is adapted to transmitting light only in a relatively narrow wavelength range centered on the emission wavelength range of the light source 16 of system 10, for example, a wavelength range having a full width at half-maximum smaller than 30 nm, for example, smaller than 20 nm, for example, smaller than 10 nm. Filter 118 enables to avoid an unwanted generation of charge carriers in the photodiode of the underlying photosites P1 and P2 under the effect of a light radiation which does not originate from the light source 16 of system 10. According to an embodiment, there are no optical filters, particularly a colored filter or an interference filter, interposed between sensor W1 and sensor W2.

Each photosite P1 of sensor W1 may further comprise a microlens 122 arranged on the front side of substrate 100, for example on top of and in contact with the filter 118 of the photosite, capable of focusing the incident light onto the photodiode 101 of photosite P1 and/or on a photodiode 133 of the underlying photosite P2.

In the shown embodiment, the back side of sensor W1 is bonded to the front side of sensor W2 by molecular bonding. For this purpose, sensor W1 comprises a layer 126, for example, made of silicon oxide, coating its back side. Further, sensor W2 comprises a layer 132 of same nature as layer 126, for example, made of silicon oxide, coating its front side. The back side of layer 126 is placed into contact with the front side of layer 132 to perform a molecular bonding of sensor W2 to sensor W1. As an example, layer 126, respectively 132, extends continuously over the entire surface of sensor W1, respectively W2. As a variant, a bonding material may be added between sensors W1 and W2 to allow the bonding of sensor W1 to sensor W2.

Each photosite P2 of sensor W2 comprises the photodiode 133 formed in substrate 130, opposite a photosite P1 of sensor W1. Photodiode 133 comprises one or a plurality of local implanted semiconductor regions formed in semiconductor substrate 130. Each photosite P2 may further comprise one or a plurality of additional components (not shown), for example, MOS transistors, formed on the back side of substrate 130, for example, in substrate 130 and on the back side of substrate 130. Sensor W2 further comprises an interconnection stack 140, formed of alternated dielectric and conductive layers coating the back side of substrate 130, having electric connection conductive tracks and/or terminals 141 connecting the photosites P2 of the sensor to a peripheral control and power supply circuit, not shown, formed therein.

In the shown embodiment, in each photosite P2 of sensor W2, the photodiode 133 of the photosite is totally surrounded with a vertical insulating wall 135 crossing substrate 130 across its entire thickness. Wall 135 particularly has an optical insulation function and may further have an electrical insulation function. As an example, vertical insulating wall 135 is made of a dielectric material, for example, silicon oxide. As a variation, vertical insulating wall 135 is a multilayer wall comprising an inner layer made of a dielectric material, for example, silicon oxide, one or a plurality of intermediate layers comprising at least one metal layer, and an outer layer made of a dielectric material, for example, silicon oxide. Vertical insulating wall 135 is for example located substantially vertically in line with the vertical insulating wall 103 surrounding the corresponding substrate portion 100 of sensor W1. Walls 103 and 135 particularly enable to limit the risk for light rays received by a close photosite P1 to disturb the corresponding photosite P2, which might result in an erroneous depth measurement.

In this embodiment, the silicon oxide layer 132 for bonding sensor W2 to sensor W1 is arranged on top of and in contact with the front side of substrate 130 in the photodetection areas of photosites P2.

The thickness of substrate 130 is for example in the range from 2 μm to 10 μm, for example, from 3 μm to 5 μm.

It should be noted that the arrangement of the sensors W1 and W2 of the device 12 of FIG. 3 is advantageous in that the interconnection stack 140 of sensor W2 is located on the side of the substrate 130 of sensor W2 opposite to sensor W1.

The stacking of photosites P1 and P2 on two levels particularly enables to increase the resolution/the image rate of acquisition device 12 for an equivalent bulk.

The light from light source 16, which is reflected by the object of the scene, is partially absorbed in the photosites P1 of the first sensor W1. The light which is not absorbed in the first sensor W1 is transmitted into the second sensor W2 and is absorbed in the photosites P2 of the second sensor W2. The different reflection phenomena in the stack may result in a bias, the photosites P2 located in the second sensor W2 receiving less photons, for an equivalent geometry and materials, than the photosites P1 located in the first sensor W1.

According to an embodiment, the bias on values (C0-C2) and (C1-C3) introduced by the attenuation of the light signal during the passage into the stack is compensated for, to allow a correct estimation of phase shift $\Delta\varphi$. The bias is compensated for by one of the means described hereafter or by a combination of two or more than two of the means described hereafter.

According to first means, the bias compensation is achieved by a calibration of the integration times, that is, the number of periods of the reflected signals having the samples collected by photosites P1 on sensor W1, for example, sample $C_0$, integrated thereon, is different from the number of periods of the reflected signals having the samples collected by photosites P2 on sensor W2 integrated thereon. According to an embodiment, the number of periods of the reflected signal having the samples collected by photosites P1 on sensor W1 integrated thereon is smaller than the number periods of the reflected signal having the samples collected by photosites P2 on sensor W2 integrated thereon.

According to second means, for each sensor W1, W2, the photosites P1, P2 of the sensor are arranged in rows and in columns and the reading of the signals stored in the photosites is carried out row by row, the signals being transmitted over bit lines extending along the columns. The bias compensation is performed at the level of the analog chain, including an analog-to-digital converter, located at the sensor column foot, the properties of the analog-to-digital converters associated with the photosites P2 of the second sensor W2 being different from the properties of the analog-to-digital converter associated with the photosites P1 of the first sensor W1. According to an embodiment, the amplification gain of the analog-to-digital converters associated with the photosites P2 of the second sensor W2 is stronger than the amplification gain of the analog-to-digital converters associated with the photosites P1 of the first sensor W1. According to an embodiment, in the case where the analog-to-digital converters are single-ramp or double-ramp converters, the compensation may be achieved by providing different slopes for the ramps of the analog-to-digital converters associated with the photosites P1 of the first sensor W1 with respect to the ramps of the analog-to-digital converters associated with the photosites P2 of the second sensor W2.

According to third means, the bias compensation is performed by a digital processing performed by the processor 20 of image forming system 10 on the signals delivered by image acquisition device 12.

According to fourth means, the bias compensation is performed by providing different absorption thicknesses between the substrate 100 of the first sensor W1 and the substrate 130 of the second sensor W2, the absorption area of the second sensor W2 being thicker than the absorption area of the first sensor W1. According to an embodiment, the thickness of second substrate 130 is greater by 10%, preferably by 20%, than the thickness of first substrate 100.

According to fifth means, the bias compensation is achieved by using optical structures (lenses, nanometer-range surface structures, maskings, etc.) enabling to adjust the quantity of photons received by the photosites P2 of the second sensor W2 with respect to the quantity of photons received by the photosites P1 of the first sensor W1. According to an embodiment, a mirror may be provided on the lower surface side of substrate 130 to reflect the photons non-absorbed in substrate 130 and increase the travel time of photons in substrate 130. According to an embodiment, walls 135 may be reflective to reflect the photons non-absorbed in substrate 130 and increase the travel time of photons in substrate 130. According to an embodiment, a diffracting structure may be provided on the upper surface side of substrate 130 to have the photons obliquely penetrate into substrate 130 and increase the travel time of photons in substrate 130.

According to sixth means, the bias compensation is achieved by the adjustment of the geometry of the stacked photosites P1 and P2. As an example, the lateral dimensions of photosite P2 may be greater than the lateral dimensions of the photosite P1 which covers it, that is, in top view, the cross-section of photosite P2 may be greater than the cross-section of photosite P1.

According to seventh means, the bias compensation is achieved by the use of different materials for the substrates 100 and 130 of the two sensors W1 and W2, the mass absorption coefficient of the material forming substrate 130 being for example greater than the mass absorption coefficient of the material forming substrate 100. According to an embodiment, substrate 100 is made of single-crystal silicon (Si) and substrate 130 is made of indium gallium arsenide (InGaAs).

Figure 4:
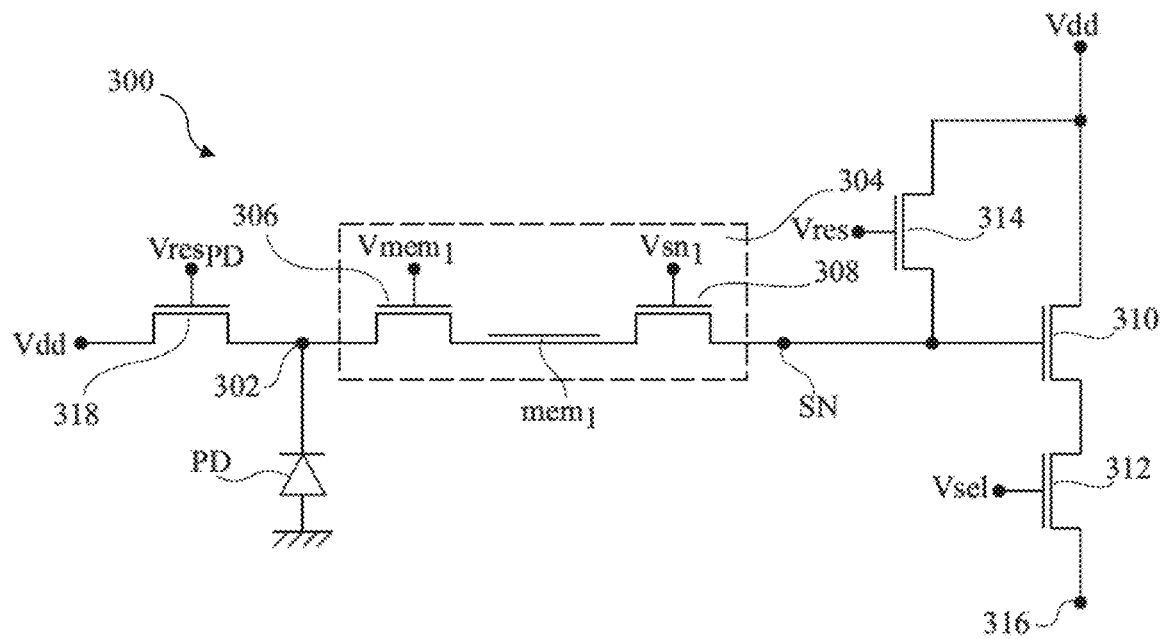
FIG. 4 schematically shows an embodiment of a circuit of a photosite capable of detecting depth information.

FIG. 4 is a circuit diagram illustrating an embodiment of a circuit 300 of a depth photosite.

Circuit 300 is capable of performing a charge storage. Circuit 300 comprises a photosensitive element PD coupled between a node 302 and a reference power supply source, for example, the ground, the photosensitive element being for example a photodiode. Node 302 is coupled to a sense node SN via a sampling circuit 304. Sampling circuit 304 comprises a memory $mem_1$ coupled to node 302 by a transfer gate 306 which is for example an n-channel MOS transistor. Memory $mem_1$ is also coupled to sense node SN by an additional transfer gate 308, which is also for example an n-channel MOS transistor. Transfer gate 306 is controlled by a signal $Vmem_1$ applied to its control node, and transfer gate 308 is controlled by a signal $Vsn_1$ applied to its control node. Memory $mem_1$ forms a charge storage area where a charge transferred from photosensitive element PD is temporarily stored.

Circuit 300 further comprises an output circuit formed of a follower source transistor 310, of a selection transistor 312, and of a reset transistor 314, these transistors for example being n-channel MOS transistors. Sense node SN is coupled to the control node of transistor 310, which for example has its drain coupled to the source of power supply voltage Vdd, and its source coupled to an output line 316 of pixel circuit 300 by transistor 312, which is controlled by a signal Vsel applied to its gate. Sense node SN is also coupled to the source of power supply voltage Vdd through transistor 314, which is controlled by a signal Vres applied to its gate. In alternative embodiments, the output circuit may be shared by a plurality of photosites, sense node SN being for example coupled to the sampling circuit of one or a plurality of adjacent photosites.

Circuit 300 further comprises a transistor 318 coupling node 302 to power supply source Vdd and enabling photodiode PD to be reset. Transistor 318 is for example controlled by a signal $Vres_{PD}$. It thus enables to control the exposure time by ensuring an emptying of photodiode PD before a synchronous integration starting for all the sensor photodiodes PD and to ensure an anti-blooming function to avoid an overflow of the photodiode into memories $mem_1$ during the general reading from the array.

Figure 5:
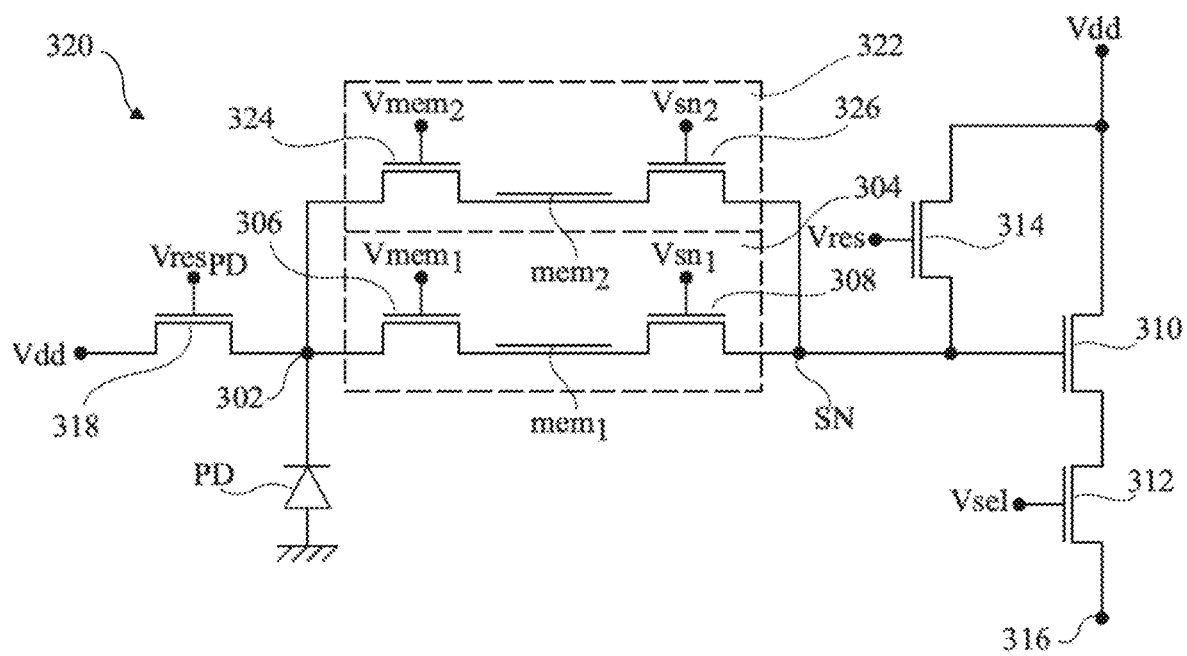
FIG. 5 schematically shows another embodiment of a circuit of a photosite capable of detecting depth information.

FIG. 5 is a circuit diagram illustrating another embodiment of a circuit 320 of a depth photosite. A similar circuit is described in further detail in French patent application with application number FR 15/63457 (agent's reference: B14596), which is incorporated herein by reference as authorized by law. For example, a timing diagram illustrating an example of operation of this circuit is shown in FIG. 3 of FR 15/63457, and the same example of operation applies in the context of the present application. Circuit 320 comprises all the elements of circuit 300 and further comprises another sampling circuit 322 connected between node 302 and node SN and comprising circuit elements similar to sampling circuit 304, and in particular circuit 322 comprises a memory $mem_2$, a transfer gate 324 controlled by a signal $Vmem_2$, and a transfer gate 326 controlled by a signal $Vsn_2$.

Circuit 320 enables to perform the acquisition of two samples for a depth image. The use of circuit 320 advantageously enables to decrease the number of transistors in a photosite. The reading from the two memories $mem_1$ and $mem_2$ is performed sequentially.

Figure 6:
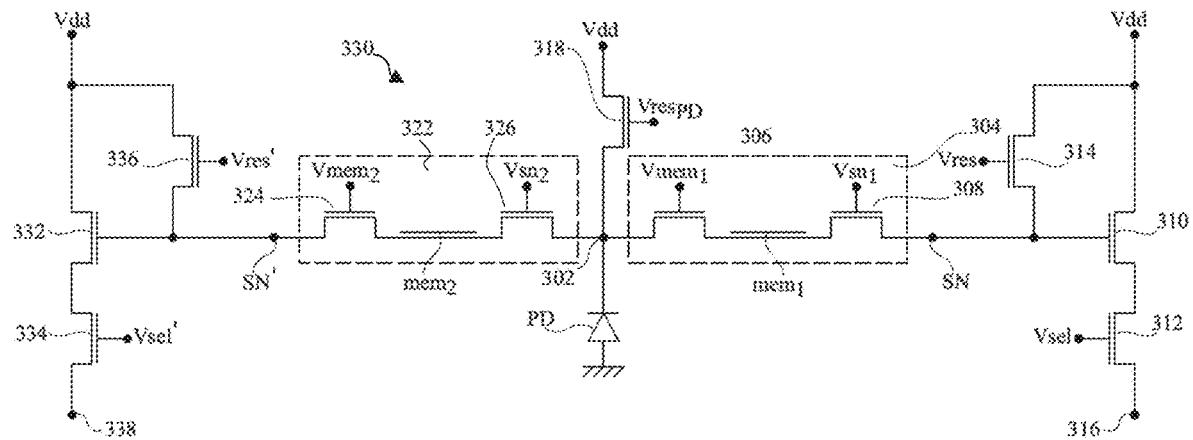
FIG. 6 schematically shows another embodiment of a circuit of a photosite capable of detecting depth information.

FIG. 6 is a circuit diagram illustrating another embodiment of a circuit 330 of a depth photosite. Circuit 330 comprises all the elements of circuit 320 shown in FIG. 5, with the difference that sampling circuit 322 is connected between node 302 and a node SN' and that it further comprises an output circuit formed of a follower source transistor 332, of a selection transistor 334, and of a reset transistor 336, these transistors being for example n-channel MOS transistors. Sense node SN' is coupled to the control node of transistor 332, which for example has its drain coupled to the source of power supply voltage Vdd, and its source coupled to an output line 338 of pixel circuit 330 by transistor 334, which is controlled by a signal Vsel' applied to its gate. Detection node SN' is also coupled to the source of power supply voltage Vdd through transistor 336, which is controlled by a signal Vres' applied to its gate. Circuit 330 enables to perform the acquisition of two samples for a depth image. The reading from the two memories $mem_1$ and $mem_2$ may be performed simultaneously.

Figure 7:
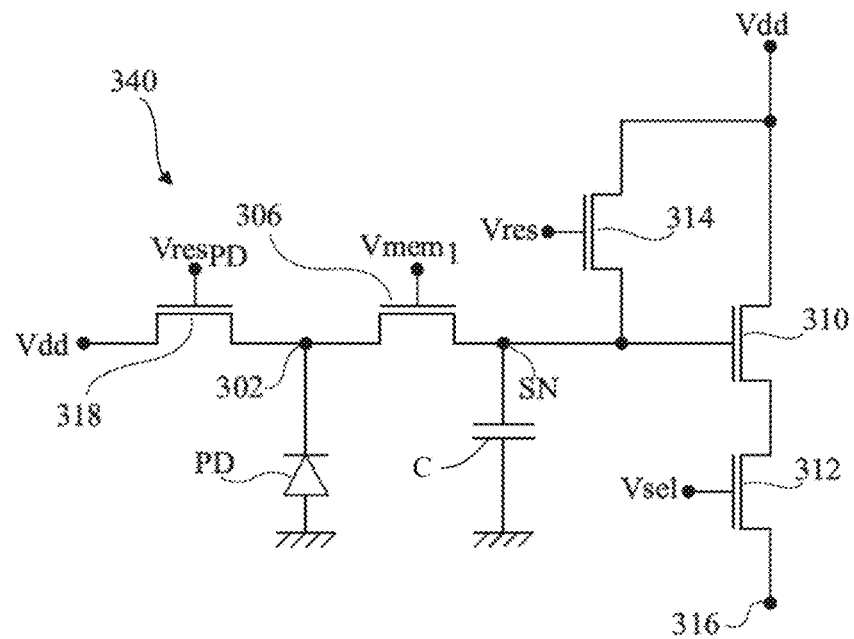
FIG. 7 schematically shows another embodiment of a circuit of a photosite capable of detecting depth information.

FIG. 7 is a circuit diagram illustrating another embodiment of a circuit 340 of a depth photosite. Circuit 340 comprises all the elements of circuit 300 shown in FIG. 4, with the difference that transistor 308 and memory $mem_1$ are not present, transistor 306 being directly connected to sense node SN.

In the case of circuit 340, the charges are directly stored on sense node SN. There is no intermediate storage. It is spoken in this case of a voltage storage. A capacitor C may be added on sense node SN, connected between sense node SN and the ground, to improve the dynamic range. The storage capacity at sense node SN may also be only formed by the interconnects necessary for the system.

The cases of photosites with two parallel or sequential readout memories may be easily derived from the photosites in charge previously discussed in relation with FIGS. 5 and 6, by suppressing transistors 308 and by replacing each memory mems and $mem_2$ with a capacitive element.

According to an embodiment, each depth pixel comprises at least one photosite P1 and one photosite P2 for the acquisition of the samples necessary for the determination of depth data, for example three samples, preferably four samples $C_0$, $C_1$, $C_2$, and $C_3$. All the transistors 306 of the photosites of a same depth pixel are synchronously controlled, control signals $Vmem_1$, $Vmem_2$ being phase-shifted with respect to each other for the acquisition of samples $C_0$, $C_1$, $C_2$, and $C_3$. As an example, the control signals $Vmem_1$, $Vmem_2$ of the transistors 306, 324 of the photosites of a same depth pixel may be obtained from a same periodic signal.

Advantageously, the transistors 306 of the photosites of a same depth pixel are distributed between sensor W1 and W2 and are not all in the same sensor W1 or W2.

Figure 8:
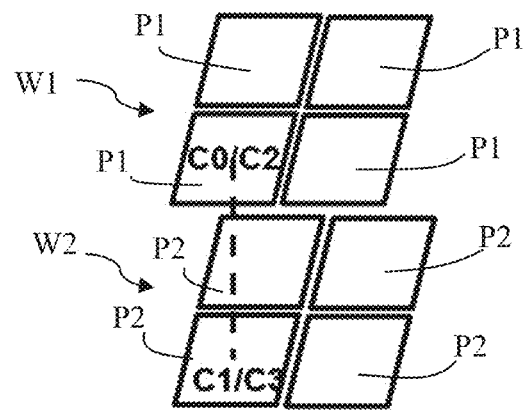
FIG. 8 schematically shows an embodiment of an arrangement of photosites of a depth image acquisition device.
Figure 9:
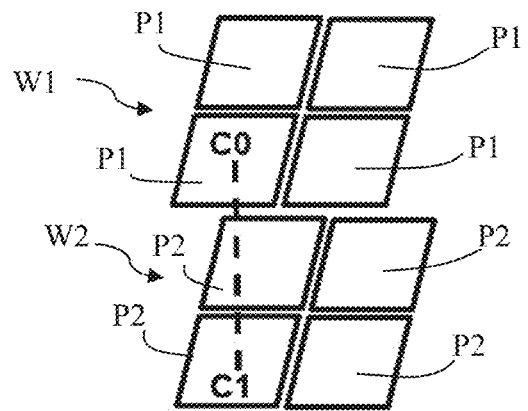
FIG. 9 schematically shows another embodiment of an arrangement of photosites of a depth image acquisition device.
Figure 10:
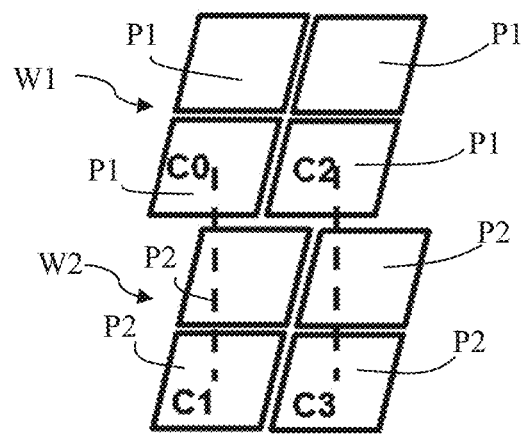
FIG. 10 schematically shows another embodiment of an arrangement of photosites of a depth image acquisition device.

FIGS. 8, 9, and 10 each schematically show an embodiment of an arrangement of photosites of a depth image acquisition device. In these embodiments, the acquisition device only comprises photosites P1 and P2 for the determination of a depth image. In particular, the acquisition device comprises an array of photosites P1 in sensor W1 and an array of photosites P2 in the second sensor W2, a portion only of each of these arrays being shown in FIGS. 8, 9, and 10.

In the embodiment of FIG. 8, each photosite P1 and P2 comprises two memories used to acquire two samples. According to an embodiment, for each pair of stacked photosites, one of the photosites is used for the acquisition of two samples, for example, photosite P1 for samples $C_0$ and $C_2$, and the other one of the photosites is used for the acquisition of two complementary samples, for example, photosite P2 for samples $C_1$ and $C_3$. The four samples $C_0$, $C_1$, $C_2$, and $C_3$ are captured in a single image.

In the embodiment of FIG. 9, each photosite P1 and P2 comprises a memory used to successively acquire two samples. According to an embodiment, for each pair of stacked photosites, one of the photosites is used to successively acquire two samples, for example, photosite P1 for samples $C_0$ and $C_2$, and the other one of the photosites is used for the successive acquisition of two complementary samples, for example, photosite P2 for samples $C_1$ and $C_3$. The four samples $C_0$, $C_1$, $C_2$, and $C_3$ are captured in two images.

In the embodiment of FIG. 10, each photosite P1 and P2 comprises a memory used to acquire a sample. The acquisition of four samples is obtained by using two photosites P1 of the first sensor W1 and two photosites P2 of the second circuit W2. According to an embodiment, the photosites P1 of the first sensor W1 are distributed in pairs. For each pair of photosites, a first photosite P1 in the pair is used for the acquisition of a first sample, for example, $C_0$, and the second photosite P1 in the pair is used for the acquisition of a second sample, for example, $C_2$, the photosite P2 of the second sensor W2 covered with the first photosite P1 is used for the acquisition of a third sample, for example, $C_1$, and the photosite P2 of the second sensor W2 covered with the second photosite P1 is used for the acquisition of a fourth sample, for example, $C_3$. The four samples $C_0$, $C_1$, $C_2$, and $C_3$ are captured in a single image.

In addition to acquiring a depth image, the acquisition device 12 of the system 10 shown in FIG. 1 may be capable of acquiring a 2D image.

Figure 11:
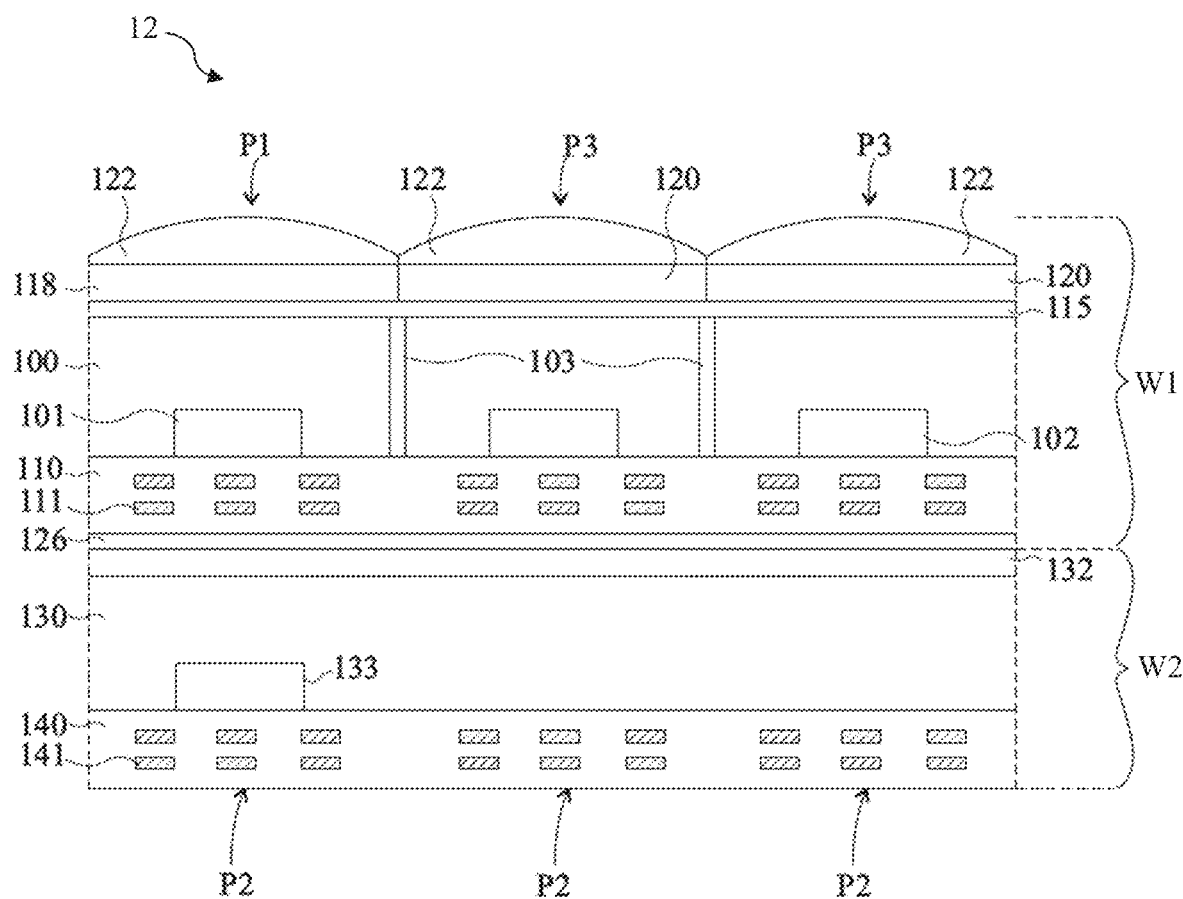
FIG. 11 is a partial simplified cross-section view illustrating an embodiment of a 2D image and depth image acquisition device.

FIG. 11 is a cross-section view schematically and partially illustrating an embodiment of a device 12 of acquisition of a 2D image and of a depth image of a scene.

In the embodiment of FIG. 11, sensor W1 further corresponds to a 2D color image sensor, that is, it comprises, in addition to depth photosites P1, pixels P3 of different types, adapted to measuring light intensities in different visible wavelength ranges. For this purpose, each pixel P3 comprises a photodiode 102 adapted to capturing at least a portion of the visible light and a color filter 120, for example, a colored resin layer, arranged on the front side of substrate 100, for example, on top of and in contact with the front side of passivation layer 115, opposite the pixel photodiode 102. As an example, sensor W1 comprises three types of pixels P3, first pixels P3 called blue pixels, comprising a color filter 120 mostly transmitting blue light, second pixels P3 called red pixels, comprising a color filter 120 mostly transmitting red light, and third pixels P3 called green pixels, comprising a color filter 120 mostly transmitting green light. In FIG. 11, the different types of pixels P3 are not differentiated. As a variation, sensor W1 may be a monochromatic 2D image sensor, in which case filters 120 may be omitted.

The second sensor W2 only comprises depth photosites P2. Each depth photosite P2 of the second sensor W2 is covered with a depth photosite P1 of the first sensor W1. According to an embodiment, the lateral dimensions of the depth photosites P2 of the second sensor W2 may be equal to the lateral dimensions of the depth photosites P1 of the first sensor W1. According to another embodiment, the lateral dimensions of the depth photosites P2 of the second sensor W2 are greater than the lateral dimensions of the depth photosites P1 of the first sensor W1.

The stacking of photosites P1 and P2 on two levels allows in particular the optimized integration of a depth image acquisition device in an array of pixels P3 for the acquisition of a 2D image while limiting the impact on the resolution of the 2D image, while simplifying the integration of the readout transistors of each depth pixel.

Figure 12:
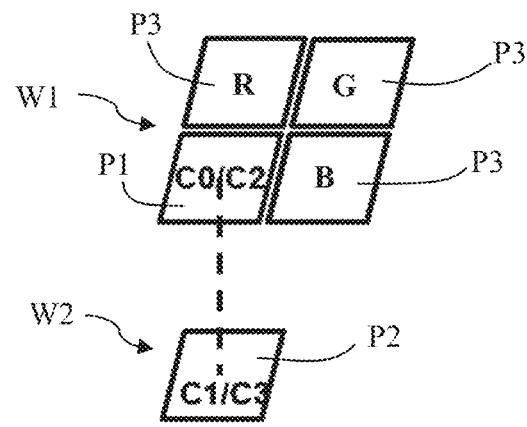
FIG. 12 schematically shows an embodiment of an arrangement of photo sites of a 2D image and depth image acquisition device.
Figure 13:
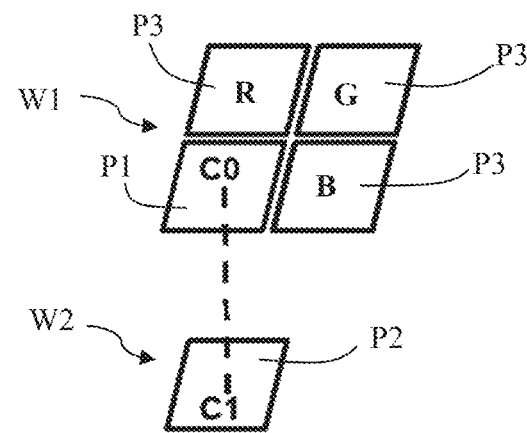
FIG. 13 schematically shows another embodiment of an arrangement of photosites of a 2D image and depth image acquisition device.
Figure 14:
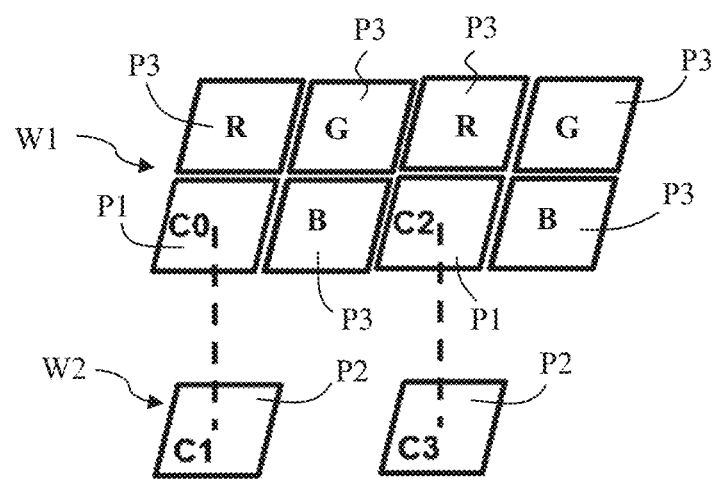
FIG. 14 schematically shows another embodiment of an arrangement of photosites of a 2D image and depth image acquisition device.

FIGS. 12, 13, and 14 each schematically show an embodiment of an arrangement of photosites of a 2D image and depth image acquisition device. In these embodiments, the acquisition device comprises photosites P1 and P2 for the determination of a depth image and pixels P3 adapted to capturing the red (R), green (G), and blue (B) light for the acquisition of a 2D image. In particular, the acquisition device comprises an array of depth photosites P1 and of pixels P3 for the acquisition of a S2 image in the first sensor W1 and an array of depth photosites P2 in the second sensor W2, a portion only of each of these arrays being shown in FIGS. 12, 13, and 14. In the first sensor W1, photosites P1 and pixels P3 may be arranged in a Bayer array, with the difference that depth photosites P1 are arranged at some of the locations of the pixels P3 capturing green light (G) of the Bayer array.

In the embodiment of FIG. 12, each depth photo site P1 and P2 comprises two memories used to acquire two samples. According to an embodiment, for each pair of stacked depth photosites, one of the depth photosites is used for the acquisition of two samples, for example, photosite P1 for samples $C_0$ and $C_2$, and the other one of the depth photosites is used for the acquisition of two complementary samples, for example, photosite P2 for samples $C_1$ and $C_3$. The four samples $C_0$, $C_1$, $C_2$, and $C_3$ are captured in a single image.

In the embodiment of FIG. 13, each depth photo site P1 and P2 comprises a memory used to successively acquire two samples. According to an embodiment, for each pair of stacked depth photosites, one of the depth photosites is used for the successive acquisition of two samples, for example, photosite P1 for samples $C_0$ and $C_2$, and the other one of the depth photosites is used for the successive acquisition of two complementary samples, for example, photosite P2 for samples $C_1$ and $C_3$. The four samples $C_0$, $C_1$, $C_2$, and $C_3$ are captured in two images.

In the embodiment of FIG. 14, each depth photo site P1 and P2 comprises a memory used to acquire a sample. The acquisition of four samples is obtained by using two depth photosites P1 of the first sensor W1 and two depth photosites P2 of the second sensor W2. According to an embodiment, the depth photosites P1 of the first sensor W1 are distributed in pairs. For each pair of depth photosites, a first depth photosite P1 in the pair is used for the acquisition of a first sample, for example, $C_0$, and the second depth photosite P1 in the pair is used for the acquisition of a second sample, for example, $C_2$, the depth photosite P2 of the second sensor W2 covered with the first depth photosite P1 is used for the acquisition of a third sample, for example, $C_1$, and the depth photosite P2 of the second sensor W2 covered with the second depth photosite P1 is used for the acquisition of a fourth sample, for example, $C_3$. The four samples $C_0$, $C_1$, $C_2$, and $C_3$ are captured in a single image.

Various embodiments and variants have been described. Those skilled in the art will understand that certain features of these various embodiments and variants may be combined, and other variants will occur to those skilled in the art. Finally, the practical implementation of the described embodiments and variations is within the abilities of those skilled in the art based on the functional indications given hereabove.

The invention claimed is:

1. Device of acquisition of a depth image of a scene by detection of a reflected light signal corresponding to the reflection on the scene of a periodically amplitude-modulated incident light signal in near infrared, the device comprising a stack of a first sensor and of a second sensor, the first sensor comprising first depth photosites configured to acquire at least one first sample of charges photogenerated by detection of the light signal reflected during first time periods, the second sensor comprising second depth photosites arranged opposite the first depth photosites, the second depth photosites being configured to acquire at least one second sample of charges photogenerated by detection of the light signal reflected during second time periods offset with respect to the first time periods by a first constant phase shift, the first sensor or the second sensor further comprising third depth photosites configured to acquire at least one third sample by detection of the light signal reflected during third time periods offset with respect to the first time periods by a second constant phase shift different from the first phase shift.

2. Device according to claim 1, further comprising means for compensating for the difference in quantities of received photons between the first and second sensors.

3. Device according to claim 1, wherein the first sensor is formed inside and on top of a first semiconductor substrate and wherein the second sensor is formed inside and on top of a second semiconductor substrate.

4. Device according to claim 3, wherein the first and second semiconductor substrates are made of different materials.

5. Device according to claim 3, wherein the thicknesses of the first and second semiconductor substrates are different.

6. Device according to claim 1, wherein the lateral dimensions of the first depth photosites are different from the lateral dimensions of the second depth photosites.

7. Device according to claim 1, wherein the first and third depth photosites are confounded.

8. Device according to claim 1, wherein the first and third depth photosites are distinct.

9. Device according to claim 1, wherein the first sensor or the second sensor comprises fourth depth photosites configured to acquire at least one fourth sample by detection of the light signal reflected during fourth time periods offset with respect to the first time periods by a third constant phase shift different from the first and second phase shifts.

10. Device according to claim 9, wherein the second and fourth depth photosites are confounded.

11. Device according to claim 9, wherein the second and fourth depth photosites are distinct.

12. Device according to claim 1, wherein the second time periods are longer than the first time periods.

13. Device according to claim 1, wherein each first and second depth photosite comprises a photodiode and at least one transistor connected to the photodiode.

14. Device according to claim 1, wherein the first sensor further comprises a plurality of 2D image pixels, the second sensor comprising no 2D image pixel.

15. System of acquisition of a depth image comprising the acquisition device according to claim 1, a light source configured to emit the periodically amplitude-modulated incident light signal in near infrared, and a processor configured to determine, from the first, second, and third samples, a phase shift between the incident light signal and the reflected light signal.

16. System according to claim 15, wherein the first sensor or the second sensor comprises fourth depth photosites configured to acquire at least one fourth sample by detection of the light signal reflected during fourth time periods offset with respect to the first time periods by a third constant phase shift different from the first and second phase shifts; and wherein the processor is configured to determine, from the first, second, third, and fourth samples, a phase shift between the incident light signal and the reflected light signal.

17. System according to claim 15, further comprising means for compensating for the difference in quantities of received photons between the first and second sensors.

18. System according to claim 15, wherein the processor is configured to compensate by digital processing for the difference in quantities of received photons between the first and second sensors.

19. System according to claim 15, comprising first amplifiers of the analog signals delivered by the first depth photosites with a first amplification gain and second amplifiers of the analog signals delivered by the second depth photosites with a second amplification gain different from the first amplification gain.

* * * * *